US008377757B2

(12) United States Patent
Hawe et al.

(10) Patent No.: US 8,377,757 B2
(45) Date of Patent: Feb. 19, 2013

(54) DEVICE AND METHOD FOR TRANSIENT VOLTAGE SUPPRESSOR

(75) Inventors: Francis Edward Hawe, Santa Clara, CA (US); Jinsui Liang, Shanghai (CN); Xiaoqiang Cheng, Shanghai (CN); Xianfeng Liu, Shanghai (CN)

(73) Assignee: Shanghai SIM-BCD Semiconductor Manufacturing Limited, Shanghai (CN)

( * ) Notice: Subject to any disclaimer, the term of this patent is extended or adjusted under 35 U.S.C. 154(b) by 238 days.

(21) Appl. No.: 12/772,156

(22) Filed: Apr. 30, 2010

(65) Prior Publication Data
US 2011/0266592 A1 Nov. 3, 2011

(30) Foreign Application Priority Data

Apr. 30, 2010 (CN) .......................... 2010 1 0168908

(51) Int. Cl.
*H01L 21/332* (2006.01)
(52) U.S. Cl. ................ 438/140; 257/109; 257/E21.356; 257/E29.327
(58) Field of Classification Search .................. 438/140; 361/91.5; 257/E21.532, E21.051, 173, E21.356, 257/E29.171, E29.174, E29.327, 109
See application file for complete search history.

(56) References Cited

U.S. PATENT DOCUMENTS

| 7,276,425 | B2 | 10/2007 | Averett et al. | |
|---|---|---|---|---|
| 7,538,395 | B2 | 5/2009 | Keena et al. | |
| 7,579,632 | B2 | 8/2009 | Salih et al. | |
| 2003/0228848 | A1* | 12/2003 | Escoffier et al. | 455/91 |
| 2004/0070029 | A1* | 4/2004 | Robb et al. | 257/332 |
| 2005/0035398 | A1* | 2/2005 | Williams et al. | 257/329 |
| 2006/0246652 | A1* | 11/2006 | Grivna et al. | 438/234 |
| 2009/0072315 | A1* | 3/2009 | Hodel et al. | 257/356 |
| 2009/0250720 | A1 | 10/2009 | Saucedo-Flores et al. | |
| 2009/0273868 | A1 | 11/2009 | Liu et al. | |
| 2009/0273876 | A1 | 11/2009 | Liu et al. | |
| 2009/0302424 | A1 | 12/2009 | Duskin et al. | |
| 2010/0060349 | A1* | 3/2010 | Etter et al. | 327/552 |
| 2010/0090306 | A1* | 4/2010 | Salih et al. | 257/491 |
| 2011/0021009 | A1* | 1/2011 | Marreiro et al. | 438/492 |

OTHER PUBLICATIONS

CEI/IEC 61000-4-2, "Electromagnetic compatibility (EMC)—Part 4-2: Testing and Measurement Techniques—Electrostatic Discharge Immunity Test", Edition 1.2, International Electrotechnical Commission, Apr. 2001, 75 pages total.
Marreiro, et al., "Multi-Channel, High Density, Ultra-Low Capacitance Arrays for ESD and Surge Protection," 46th Annual International Reliability Physics Symposium, Phoenix, Arizona 2008, IEEE International, pp. 637-638.

* cited by examiner

*Primary Examiner* — Caridad Everhart
(74) *Attorney, Agent, or Firm* — Kilpatrick Townsend & Stockton LLP

(57) ABSTRACT

A transient voltage suppressor (TVS) device includes a semiconductor substrate of a first conductivity type, and a first and a second semiconductor regions of a second conductivity type overlying the semiconductor substrate. A semiconductor layer of the second conductivity type overlies the first and the second semiconductor regions. The TVS device has a first trench extending through the semiconductor layer and the first semiconductor region and into the semiconductor substrate, and a fill material of the second conductivity type disposed in the first trench. A clamping diode in the TVS device has a junction between an out-diffused region from the fill material and a portion of the semiconductor substrate. The TVS device also includes a first P-N diode formed in a first portion of the semiconductor layer, and a second P-N diode having a junction between the second semiconductor region and the semiconductor substrate.

32 Claims, 13 Drawing Sheets

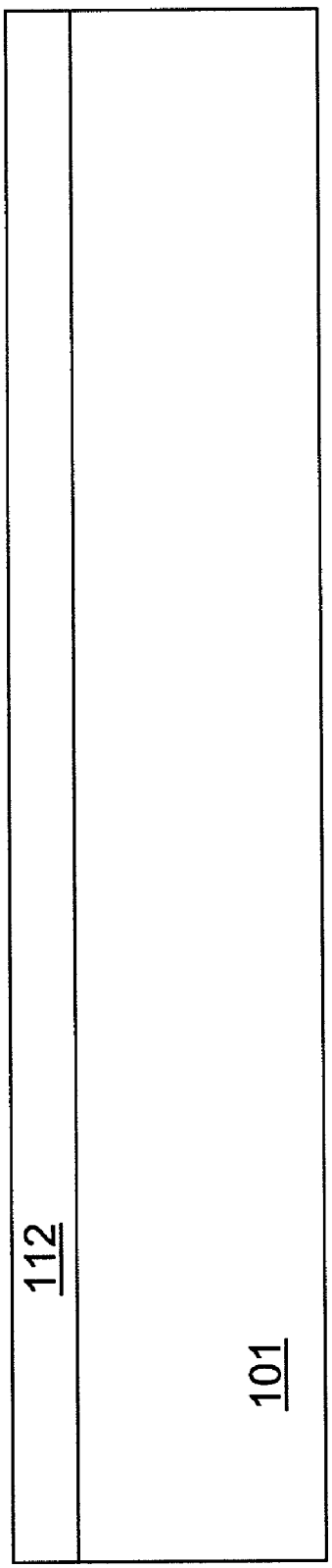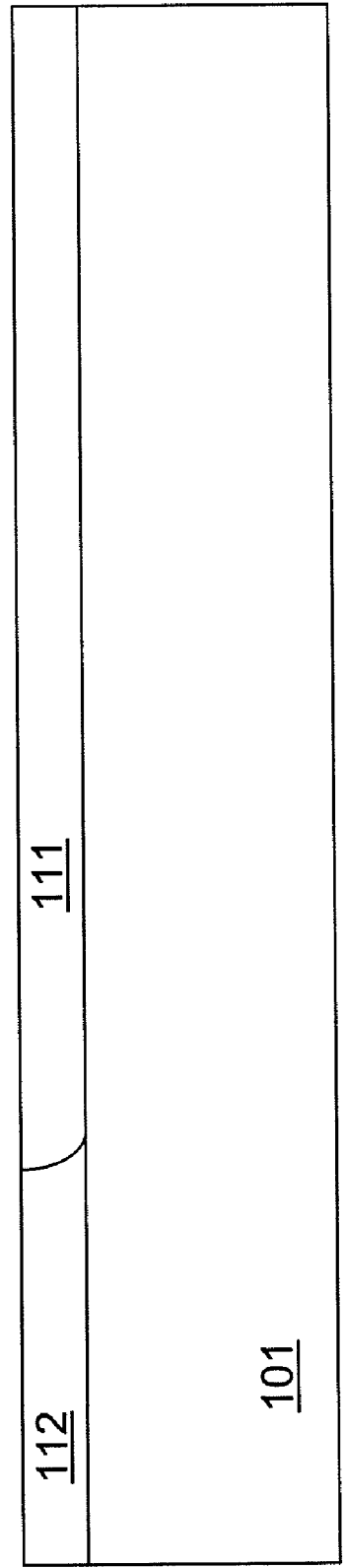

DEVICE AND METHOD FOR TRANSIENT VOLTAGE SUPPRESSOR

CROSS-REFERENCES TO RELATED APPLICATIONS

This application claims priority to Chinese Patent Application No. 2001010168908.5 filed Apr. 30, 2010, by inventors Francis Hawe et. al., commonly assigned and incorporated in its entirety by reference herein for all purposes.

BACKGROUND OF THE INVENTION

Embodiments of the present invention are directed generally to semiconductor devices, and more particularly, devices and methods for providing transient voltage suppression for integrated circuits.

As integrated circuit technology continues to advance, devices are becoming smaller and operating voltages lower. At the same time, the devices are becoming faster and operating frequencies are higher. As a result, it is more difficult for transient voltage suppressor (TVS) or electrostatic discharge (ESD) protection devices to meet these requirements for today's integrated circuits. The TVS or ESD devices must provide a low breakdown voltage and low capacitance to satisfy the low voltage high speed requirements.

Many conventional TVS or ESD protection devices use a Zener (p+/n+ junction), diode to provide this ESD protection. Certain conventional electrostatic discharge (ESD) protection devices use the n+/p+ junction between an n-type region and the underlying p-type substrate as the clamping diode, often referred to as a Zener diode. After the clamping diodes are formed, other devices, such as P-N diodes are formed on top of this Zener diode to result in the other desired devices. Examples of such Zener diodes are disclosed in, e.g., U.S. Pat. No. 7,579,632 issued Aug. 25, 2009 to A. Salih et. al. and U.S. Pat. No. 7,538,395 issued on May 26, 2009 to T. Keena et. al. In some of those devices, the Zener diode is the buried layer to substrate diode. In general it is important for the clamping diode to exhibit both low leakage and a desired breakdown voltage. Furthermore, even though such ESD devices appear to provide a compact structure, they can suffer from many limitations, such as process complexity and difficulty in device parameter control, especially in achieving the desired clamping voltage and leakage combination. Some of the limitations are described in more detail below.

Therefore, it is desirable to have an improved transient voltage suppressor (TVS) or electrostatic discharge (ESD) device

BRIEF SUMMARY OF THE INVENTION

As described above, certain conventional electrostatic discharge (ESD) protection devices employ a buried n+/p+ junction as a Zener diode, with other device fabricated on top of the Zener device. These Zener diode devices tend to have limitations. For example, the multiple thermal processing steps, such as epitaxial growth, diffusions, and oxidations, tend to cause the p+ dopants from the substrate to out diffuse. The resultant graded doping profile at the Zener junction can often result in higher than desired Zener breakdown voltages and make it difficult to accurately control the associated clamping voltage; this makes the device unsuitable for protection of low-voltage advanced devices. Even though the out-diffusion could probably be managed by using special processing steps, such processes are often complicated and expensive.

Embodiments of the present invention provide transient voltage suppression (TVS) device structures having low breakdown voltage and low capacitance. These devices can be used, for example, in protection circuits for low-voltage high-frequency integrated circuit applications. In some embodiments, a low-voltage clamping diode is formed at a junction between a heavily doped substrate and an out-diffused region from a trench that extends through the first n-type region into the substrate to reach a portion of the substrate exhibiting a suitable doping concentration. In certain embodiments, the trench clamping diode is coupled with one or more PIN and/or NIP diodes to form a low-capacitance and low-voltage protection circuit. These device structures can be formed using conventional integrated circuit processing technology.

In a specific embodiment, a transient voltage suppressor (TVS) device includes a p-type semiconductor substrate, and a first and a second n-type semiconductor regions overlying the semiconductor substrate. The first region has a first doping concentration and the second region having a second doping concentration that is lower than the first doping concentration. An n-type semiconductor layer overlies the first and the second n-type semiconductor regions. The TVS device also includes a plurality of trenches extending through the n-type semiconductor layer and the first n-type semiconductor region and into the p-type semiconductor substrate to form the Zener or clamping diode. An n-type fill material is disposed in each of the plurality of trenches. The p+/n+ clamping diode is formed by the n+ outdiffusion from the sidewalls of these trenches into the substrate. The resulting clamping diode is therefore in parallel with a diode junction between the first n-type semiconductor region and the p-type semiconductor substrate, and the clamping diode is configured to have a clamping voltage lower than a reverse breakdown voltage of said junction such that said junction is prevented from functioning as the Zener diode. Moreover, the TVS device includes a PIN diode and an NIP diode. The PIN diode includes a p-type region, a first portion of the n-type semiconductor layer, and the first n-type semiconductor region. The NIP diode includes an n-type region, a second portion of the n-type semiconductor layer, the second n-type semiconductor region, and the p-type semiconductor substrate. The TVS device also includes a first isolation region around the PIN diodes, and a second isolation region around the NIP diodes. Furthermore, a conductive material is used to fill the trenches that forms ohmic contact with the outdiffused n+ region surrounding the trenches resulting in a low resistance currant path from the silicon surface to the clamping diodes.

In an embodiment of the above TVS device, the fill material is in direct contact with the first semiconductor layer through a trench sidewall. In one embodiment, the fill material comprises doped polysilicon. In another embodiment, the fill material comprises a doped suicide material.

In another specific embodiment, a transient voltage suppressor (TVS) device includes a semiconductor substrate of a first conductivity type, and a first and a second semiconductor regions of a second conductivity type overlying the semiconductor substrate. The first region has a first doping concentration and the second region has a second doping concentration. A semiconductor layer of the second conductivity type overlies the first and the second semiconductor regions. The TVS device has a first trench extending through the semiconductor layer and the first semiconductor region and into the semiconductor substrate, and a fill material of the second conductivity type disposed in the first trench. A clamping diode in the TVS device has a junction between an outdiffused region from the fill material and a portion of the semiconductor substrate. The TVS device also includes a first P-N diode formed in a first portion of the semiconductor layer, and a second P-N diode having a junction between the second semiconductor region and the semiconductor substrate.

In an embodiment of the above TVS device, the clamping diode is coupled in parallel with a junction formed between the first semiconductor region and the semiconductor substrate, and the clamping diode is configured to have a clamping voltage lower than a reverse breakdown voltage of said junction such that said junction is prevented from functioning as a Zener diode. In another embodiment, the first P-N diode is disposed overlying the first semiconductor region. In another embodiment, the fill material is in direct contact with the first semiconductor layer through a trench sidewall. In yet another embodiment, the first trench is free from a dielectric layer on the trench sidewalls. In an embodiment, the first conductivity type is p-type, the second conductivity type is n-type, the first P-N diode is a PIN diode, and the second P-N diode is an NIP diode. In another embodiment, the first conductivity type is n-type, the second conductivity type is p-type, the first P-N diode is a NIP diode, and the second P-N diode is an PIN diode.

According to another embodiment, a semiconductor device includes a semiconductor substrate of a first conductivity type and a semiconductor layer of a second conductivity type overlying the semiconductor substrate. The device also includes a first trench extends through the semiconductor layer into the semiconductor substrate and a fill material of the second conductivity type disposed in the first trench. A clamping diode in the semiconductor device has a junction between an out-diffused region from the fill material and a portion of the semiconductor substrate.

In an embodiment of the above TVS device, the fill material is in direct contact with the first semiconductor layer through a trench sidewall. In another embodiment, the first trench is free from a dielectric layer on the trench sidewalls. In yet another embodiment, the semiconductor device also includes a first region in the semiconductor layer and being in contact with the first trench, and a second region in the semiconductor layer and being in contact with the semiconductor substrate, but not in contact the first trench. The semiconductor device also has a first P-N diode formed in the first region, a second P-N diode formed by the second region and the semiconductor substrate, and an isolation region separating the first P-N diode and the second P-N diode.

In an embodiment of the above semiconductor device, the isolation region includes a trench isolation region enclosing the second P-N diode. In another embodiment, the first region includes a buried region in contact with the semiconductor substrate. In another embodiment, the first P-N diode is disposed overlying the buried region.

According to another embodiment, a semiconductor device includes a semiconductor substrate of a first conductivity type and having a first doping concentration, and a first semiconductor layer of a second conductivity type overlying the semiconductor substrate. The first semiconductor layer has a second doping concentration. The semiconductor device also has a doped conductive material extending through the first semiconductor layer into the semiconductor substrate. A clamping diode is formed by the doped conductive material and a portion of the semiconductor substrate.

In an embodiment of the semiconductor device, the clamping diode includes a junction between an out-diffused region from the doped conductive material and a region in the semiconductor substrate. In another embodiment, the clamping diode has a Zener voltage of 7.00 V or lower. In another embodiment, the doped conductive material comprises a silicon containing material.

According to another embodiment, a method for forming a transient voltage suppressor (TVS) device includes providing a semiconductor substrate of a first conductivity type, and forming a first and a second semiconductor regions of a second conductivity type overlying the semiconductor substrate. The first region has a first doping concentration, and the second region having a second doping concentration. A semiconductor layer of the second conductivity type is formed overlying the first and the second semiconductor regions. A first trench is formed extending through the semiconductor layer and the first semiconductor region and into the semiconductor substrate. The method also includes disposing a fill material of the second conductivity type in the first trench, and forming a clamping diode at a junction between the fill material and the semiconductor substrate.

In a specific embodiment of the method described above, forming the clamping diode includes using a thermal process to form a clamping diode junction between an out-diffused region and a region in the semiconductor substrate. In another embodiment, forming a first trench includes forming the first trench to a selected depth into the semiconductor substrate such that the dopant concentration of the semiconductor substrate is higher at the clamping diode junction than is at a junction formed between the first semiconductor region and the semiconductor substrate. In another embodiment, disposing the fill material of the second conductivity type in the first trench includes depositing a polysilicon material.

In another embodiment, the above method also includes forming a first P-N diode farmed in a first portion of the semiconductor layer, and forming a second P-N diode having a junction between the second semiconductor region and the semiconductor substrate. In another embodiment, the method also includes forming an isolation region separating the first and the second P-N diodes. In another embodiment, the isolation region includes a trench isolation region enclosing the second P-N diode.

A further understanding of the nature and advantages of the present invention may be realized by reference to the remaining portions of the specification and the drawings.

BRIEF DESCRIPTION OF THE DRAWINGS

FIGS. 10A, 10B, and 11-13 are simplified cross-sectional diagrams illustrating a method for forming a TVS device according to an embodiment of the present invention.

DETAILED DESCRIPTION OF THE INVENTION

Embodiments of the present invention are directed to devices and methods for providing transient voltage suppression (TVS) for integrated circuits. Depending on the embodiment, the TVS devices may have one or more of the following features:
1. The TVS structure is able to survive an ESD/Surge event described by IEC 6100-4-2,(ESD) +/−15 kV(air),+/−8 kV(contact);
2. The TVS structure protects the device under protection from the ESD/Surge event described by IEC 6100-4-2, (ESD) +/−15 kV(air),+/−8 kV(contact); and
3. The TVS structure does not degrade the signal going to the device under protection.

The description below will be with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 1:
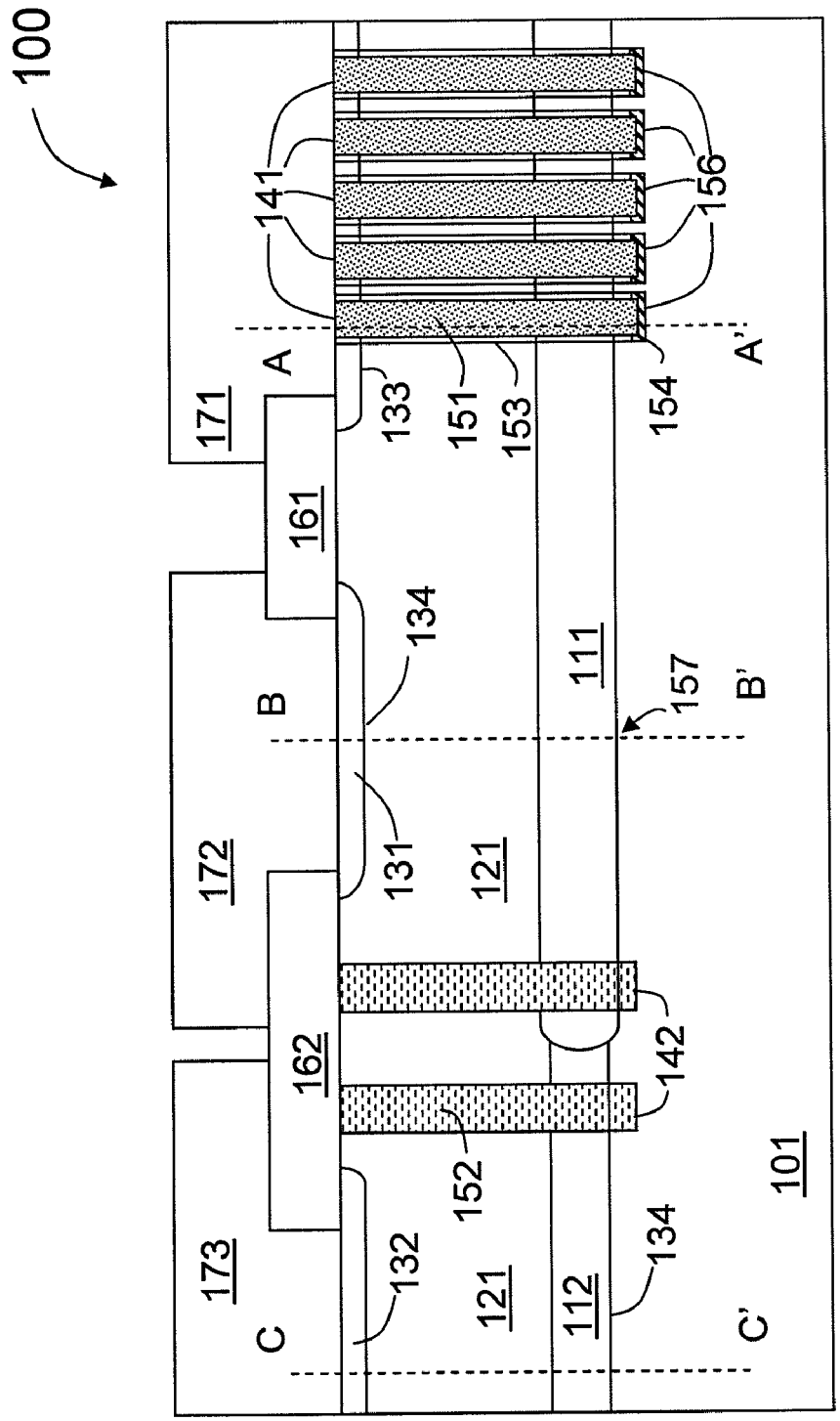
FIG. 1 is a simplified cross-sectional diagram of a transient voltage suppressor (TVS) device according to one or more embodiments of the present invention.

FIG. 1 is a simplified cross-sectional diagram of a transient voltage suppressor (TVS) device according to one or more embodiments of the present invention. As shown, TVS device 100 has a semiconductor substrate 101 of a first conductivity type, and a first and a second semiconductor regions 111 and 112 of a second conductivity type overlying semiconductor substrate 101. Region 111 has a first doping concentration and region 112 has a second doping concentration. In an embodiment, the first doping concentration in region 111 is higher than the second doping concentration in region 112.

In the description here in connection with FIG. 1, the first conductivity type is presumed to be n-type and the second conductivity type is presumed to be p-type. It is understood however that the conductivity types can be reversed in different embodiments. In some embodiments, substrate 101 is heavily doped p+ type, region 111 is heavily doped n+ type, and region 112 is lightly doped n− type. An n-type semiconductor layer 121 overlying the first and second n-type semiconductor regions 111 and 112. In some embodiments, regions 111 and 112 can be formed by epitaxial deposition over the p+ substrate 101 followed by ion implantation of a portion of lightly doped epitaxial layer 112, or by wafer bonding over the p+ substrate 101 followed by ion implantation of a portion of lightly doped epitaxial layer 112

As shown in FIG. 1, a plurality of trenches 141 extend through n-type semiconductor layer 121 and the first n-type semiconductor region 111 and into p type semiconductor substrate 101. These trenches incorporate an n+ diffusion into their sidewalls (153, 154) and bottoms, and are filled with a conductive material 151 in contact with that n+ diffusion (153, 154). In this embodiment, the dopants in the fill material is the source of the n+ diffusion. In this embodiment, there is no dielectric material on the trench sidewalls or bottoms. That is, fill material 151 is in direct contact with the first semiconductor layer 121 and semiconductor region 111 through a trench sidewall. It is noted that, in one or more embodiments of the invention, dopants from fill material 151 out diffuse through the sidewalls and the bottom region of trenches 141. The out-diffused regions are marked with reference numeral 153 on the sidewalls and marked with 154 at the bottom of trenches 141.

Figure 2:
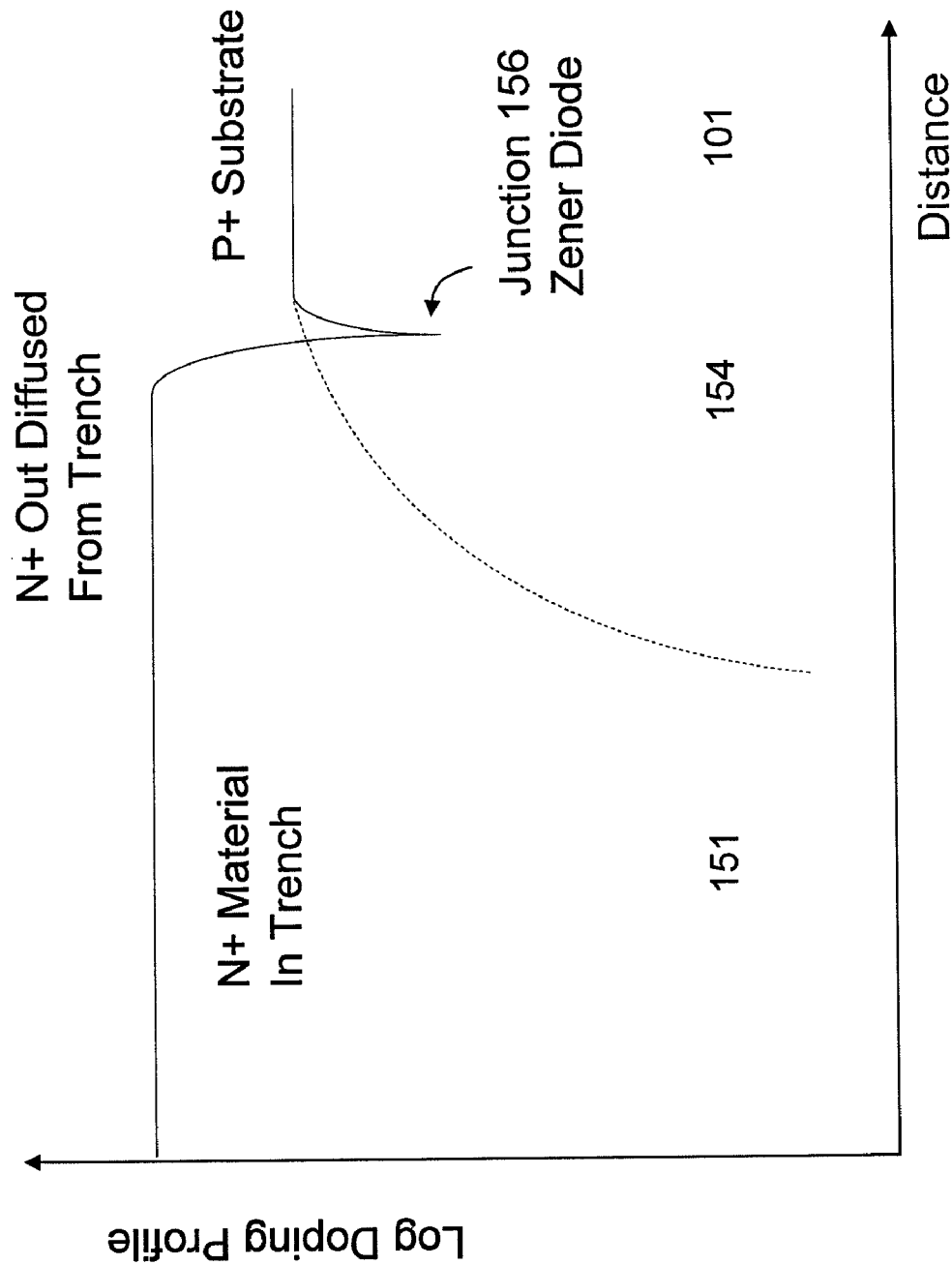
FIG. 2 illustrates a simplified doping profile across cut line A-A' in FIG. 1.

According to embodiments of the invention, the clamp diodes are formed by the junction regions between the n+ out-diffused regions 156 and a portion of the p+ semiconductor substrate 101. The clamp diode junction is illustrated in FIG. 2, which shows a simplified doping profile across cut line A-A' in FIG. 1. The same reference numerals 151, 154, and 101 from FIG. 1 are used in FIG. 2, with 151 representing the n+ material in the trench, 154 designating the n+ region formed by the out-diffused dopants from the trench, and 101 designating the p+ substrate.

It is also noted, however, that the dopants in the p+ substrate 101 out diffuse to the layers overlying the substrate and cause a graded p+ doping profile, as shown by the dotted line in FIG. 2. As explained further below, a P-N junction (e.g. junction 157 in FIG. 1) formed in the graded region with lower p+ dopant concentration will tend to have a much higher reverse breakdown voltage, and does not function as the clamping diodes in embodiments of the present invention.

Figure 3:
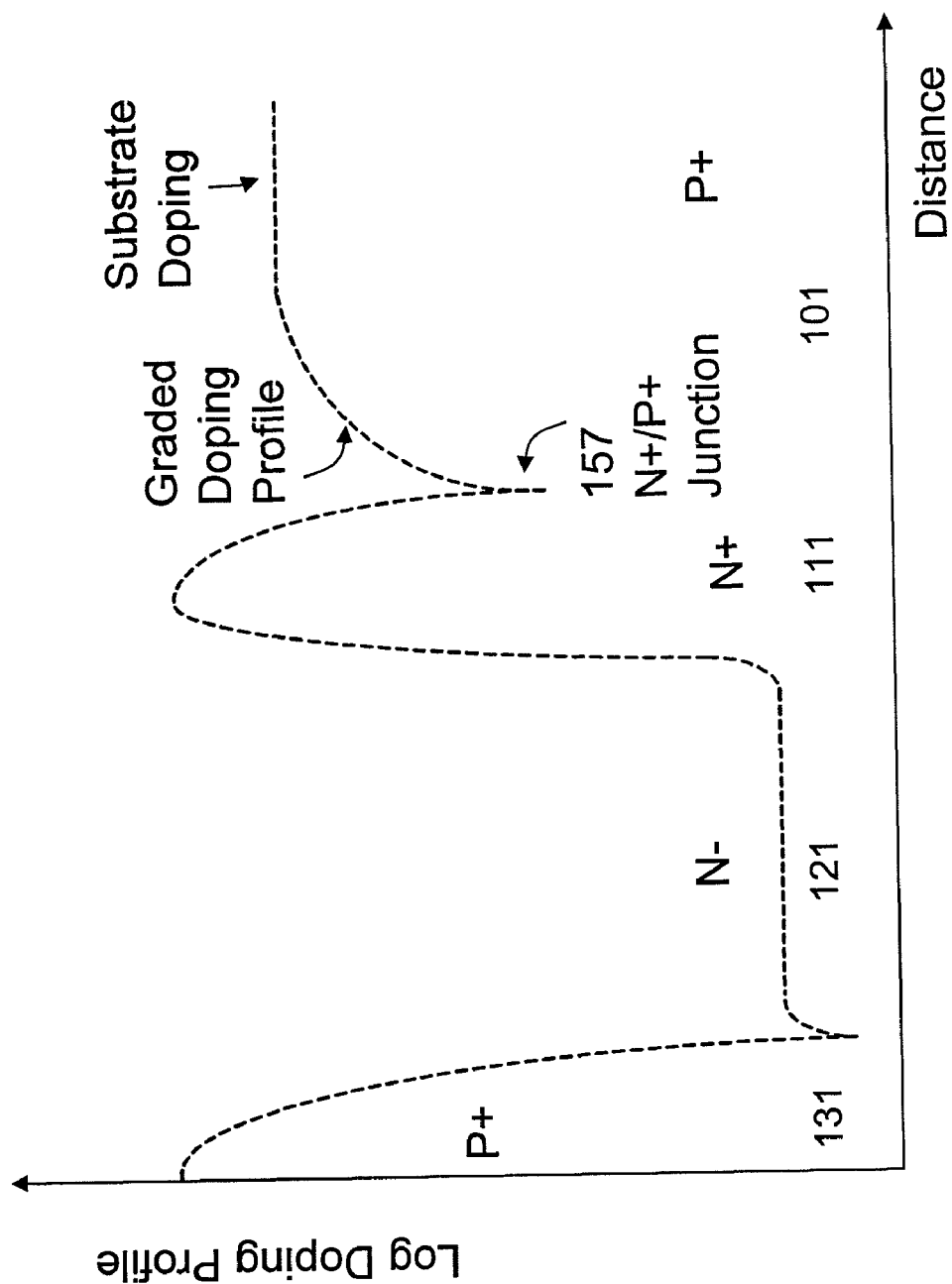
FIG. 3 illustrates a simplified doping profile across cut line B-B' in FIG. 1.

TVS device 100 also includes two additional P-N diodes. A first P-N diode (shown along cut line B-B' in FIG. 1) has a junction 134 between a p-type region 131 and a first portion of the n-type semiconductor layer 121. In this embodiment, the first PN diode is referred to as a PIN diode including a p+ region 131, an n− region 121, and an n+ region 111. FIG. 3 shows a simplified doping profile of the PIN diode across cut line B-B' in FIG. 1. It can be seen that a p+/n− junction 134 is formed between regions 131 and 121. An n+/p+ junction 157 is formed between region 111 and substrate 101. It is also noted, however, that the dopants in the p+ substrate out diffuse to the layers overlying the substrate and causes a graded p+ doping profile at junction 157. As a result, n+/p+ junction 157 tends to have relatively high reverse breakdown voltage.

Figure 4:
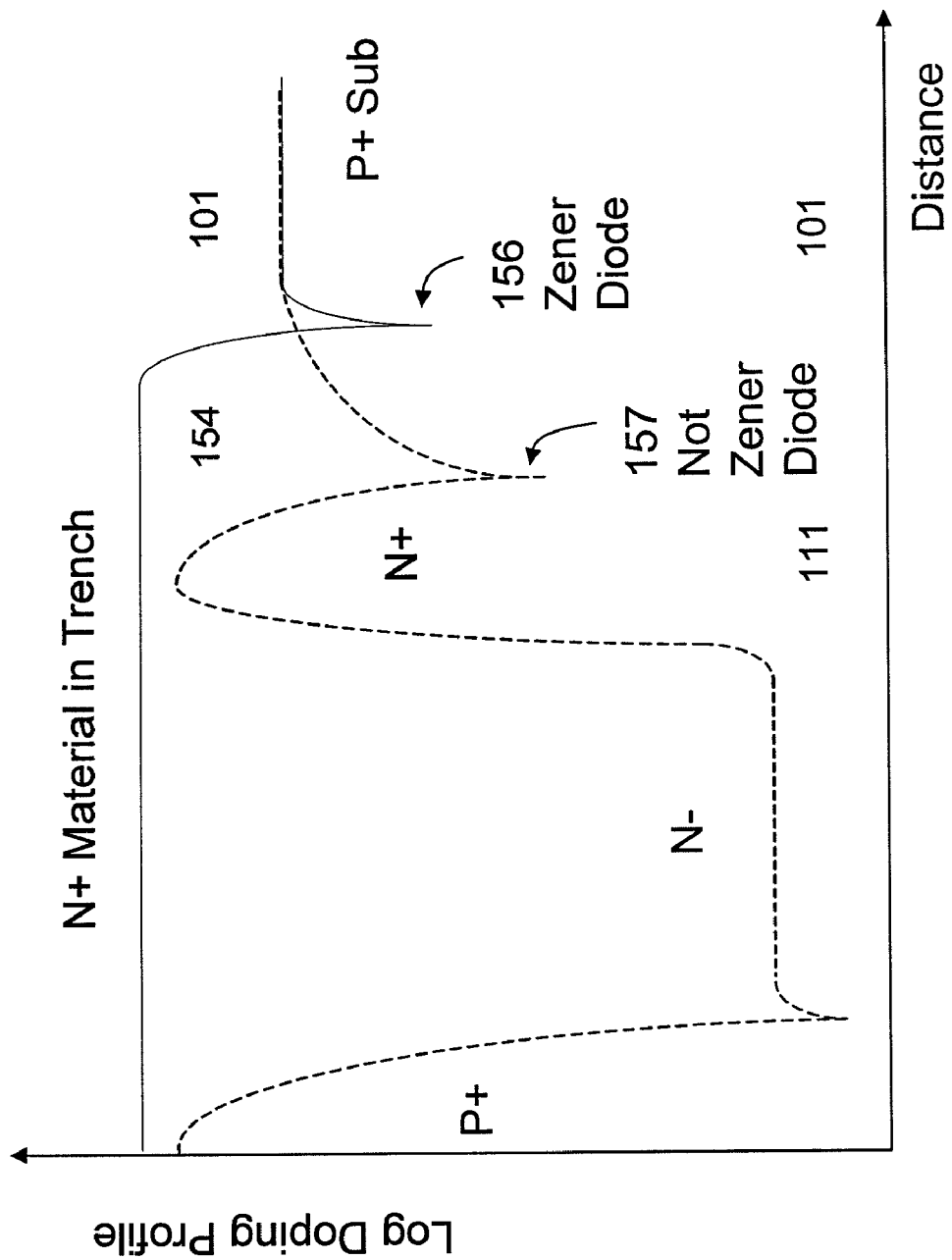
FIG. 4 is a composite plot of the doping profiles in FIGS. 2 and 3.

As shown in FIG. 1 along cut line A-A', heavily doped n+ region 111 is connected to the trench fill material 151 in trenches 141 and the out-diffused regions 153 and 154. FIG. 4 is a composite plot of the doping profiles in FIGS. 2 and 3, and illustrates dopant concentration at junction 157 (between n+ region 111 and graded p+ concentration of substrate 101) and junction 156 (between n+ out-diffused region 154 and a portion deeper in substrate 101). It can be seen that junction 156 is formed in a region having higher p+ concentration than does junction 157 and exhibits a sharper junction profile. As a result, a reverse bias between n+ regions (111 coupled with 154) and p+ substrate 101 will result in a Zener breakdown at junction 156, and not at junction 157. Therefore, in embodiments of the present invention, the clamping diode is that diode formed between out-diffused region 154 at the bottom and the trench and a portion of the substrate.

As shown in FIG. 1 along cut line A-A', a semiconductor device according to a specific embodiment of the invention includes a semiconductor substrate of a first conductivity type and having a first doping concentration, and a first semiconductor layer of a second conductivity type overlying the semiconductor substrate. The first semiconductor layer has a second doping concentration. The semiconductor device also has a doped conductive material extending through the first semiconductor layer into the semiconductor substrate, e.g. the fill material in the trench. A clamping diode is formed by the doped conductive material and a portion of the semiconductor substrate.

As shown in FIG. 1, in this embodiment, the clamping diode is coupled in parallel with an n+/p+ junction formed between the first n-type semiconductor region and the p-type semiconductor substrate. As the clamping diode 156 is configured to have a clamping voltage significantly lower than a reverse breakdown voltage of the n+/p+ junction 157. Diode 156 will define the clamping voltage, and the clamping current will flow through it, such that the n+/p+ 157 is prevented from functioning as a Zener diode.

Figure 5:
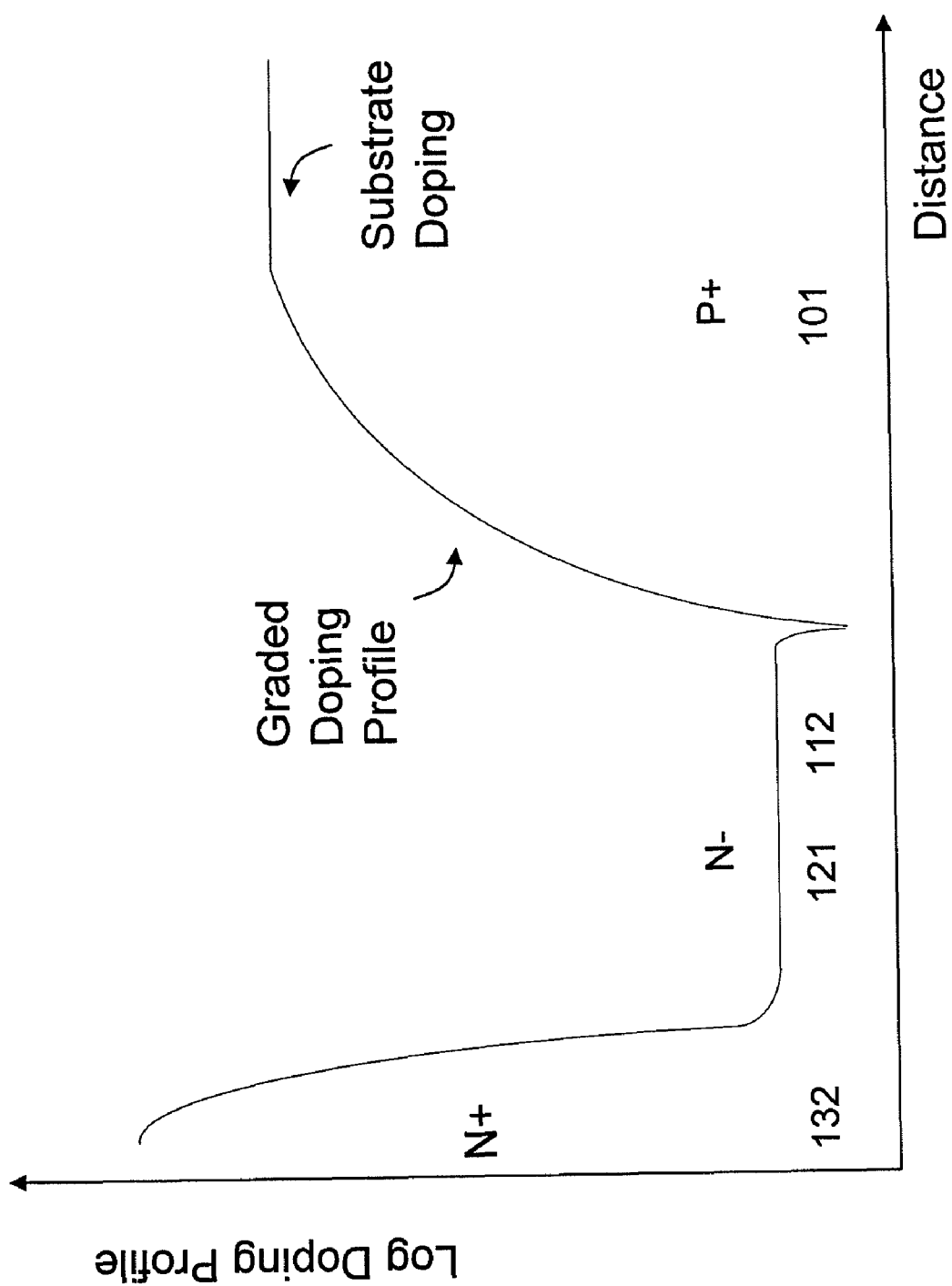
FIG. 5 illustrates a simplified doping profile across cut line C-C' in FIG. 1.

In the embodiment shown in FIG. 1, the second P-N diode (along cut line C-C') is referred to an NIP diode having an n+ region 132, an n− region including a portion of layer 121 and region 112, and a p+ region in substrate 101. A simplified doping profile of the NIP diode across cut line C-C' in FIG. 1 is shown in FIG. 5. It can be seen that an n−/p+ junction is formed between region 112 and substrate 101. It is also noted that the p+ dopants in substrate 101 diffuse out and form a graded p-type doping concentration.

As shown in FIG. 1, TVS device 100 also includes an isolation region 142 separating the first and the second P-N diodes. In an embodiment, the isolation region includes two isolation trenches 142, each having an insulating material 152 in the trench. In some embodiments, the isolation region includes isolation trenches enclosing the NIP diode and the PIN diode.

In one or more embodiments, TVS device 100 further includes a first conductors 171, 172, and 173. For an I/O circuit protection application, conductors 172 and 173 can be shorted to form the I/O, as shown below in FIG. 6. 172 coupling the first and the second P-N diodes, and a second conductor 171 coupling the n-type fill material 151 disposed in each of trenches 141.

Figure 6:
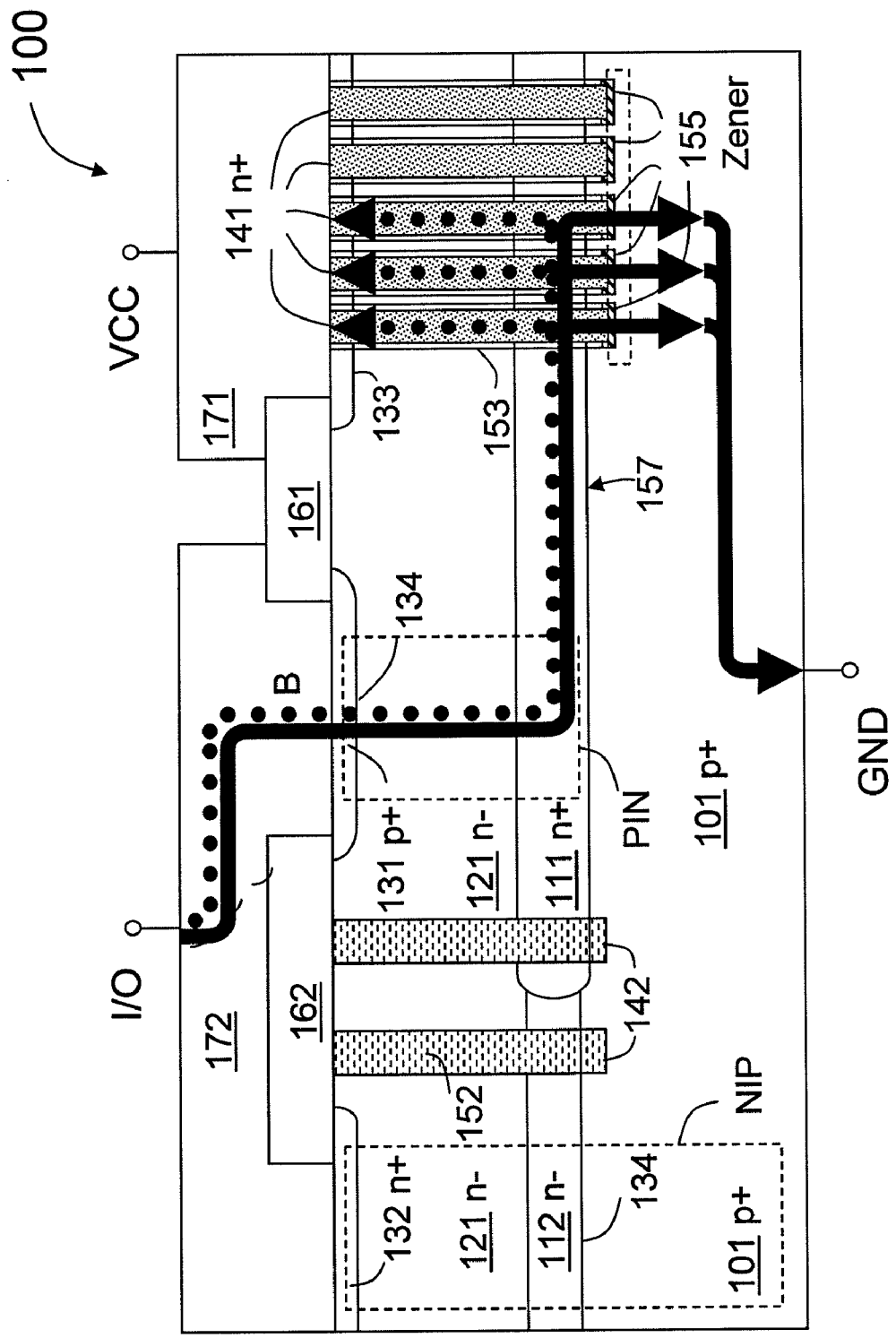
FIG. 6 illustrates current flow in the TVS device of FIG. 1 configured as an I/O protection device.

In some embodiments, TVS device 100 described above can be used for transient voltage protection of an I/O terminal in an integrated circuit. FIG. 6 illustrates an example of such application. As shown, conductor 172 is connected to an I/O terminal and the PIN diode and NIP diode. Portions of the PIN and NIP diodes are marked by dotted boxes in FIG. 6. Conductor 171 is connected to the trenches with the n+ doped material, and substrate 101 is connected to a ground terminal. In this example, VCC is about 5V, and the Zener diode is configured to have a Zener breakdown voltage at about 6.5V. Depending on the voltage at the I/O terminal, the operation of this embodiment of a TVS device 100 has four distinct modes:

1. When the I/O terminal voltage is between VCC plus the PIN forward voltage diode drop and VSS (a ground potential) minus one NIP forward voltage diode drop, only leakage I/O current will flow. At or below VCC (5V), the PIN diode is not turned on, and TVS device 100 has no current flow.
2. When the I/O terminal voltage is between 5V plus the PIN forward voltage diode drop and 6.5V plus the PIN forward voltage drop, the PIN diode is forward biased, and a current flows through the PIN diode, through the trench to VCC terminal 171, as illustrated by the dotted lines.
3. When the I/O terminal voltage is higher than 6.5 V plus the PIN forward voltage drop, increasing VCC to above 6.5V, the clamping diode will break down, and the current flows through the PIN diode and the clamping diode to the substrate, which is connected to the ground terminal. This current flow is illustrated by the thick solid lines.
4. When the I/O terminal is biased to less than Vss minus one NIP forward voltage drop, the I/O current will flow through the NIP to the substrate.

Figure 7:
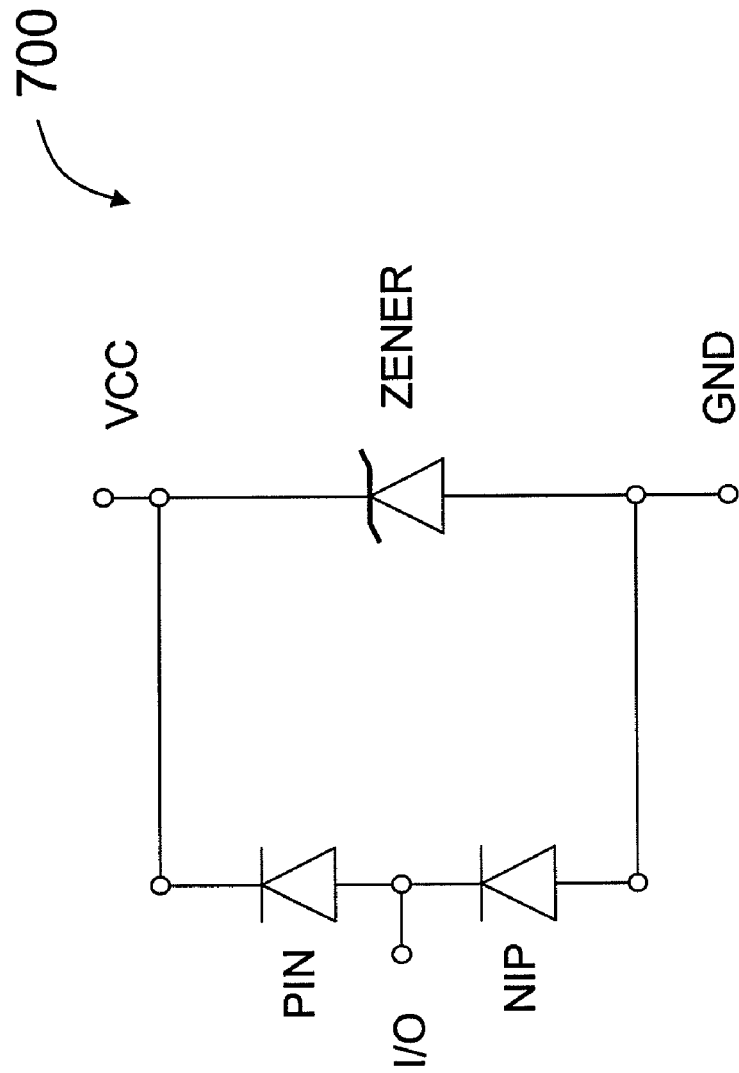
FIG. 7 is a simplified schematic diagram of the TVS device in FIG. 1 configured as an I/O protection device.

FIG. 7 is a simplified schematic diagram of the TVS device in FIG. 6 configured as an I/O protection device. FIG. 7 is a simplified schematic diagram illustrating TVS device 100 of FIG. 6 according to an embodiment of the present invention. As shown the I/O terminal is coupled to the anode of the PIN diode and the cathode of the NIP diode. The cathode of the PIN diode is coupled to the cathode of the Zener diode and the VCC terminal. The anode of the NIP diode and then anode of the Zener diode, both formed in substrate 101 of TVS device 100, are coupled to the ground terminal (GND).

Figure 8:
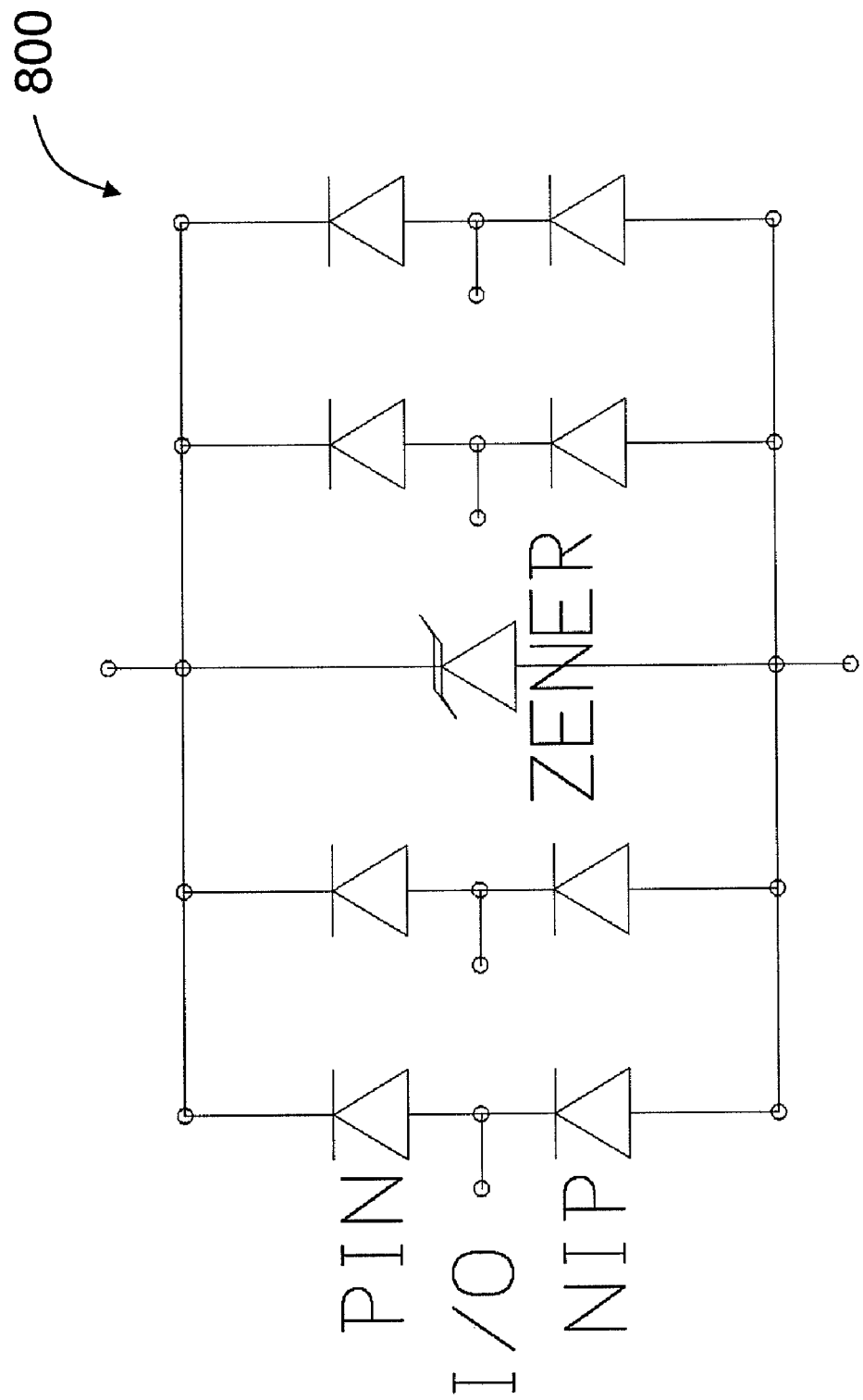
FIG. 8 is a simplified schematic diagram illustrating a TVS device 800 according to another embodiment of the present invention.

FIG. 8 is a simplified schematic diagram illustrating a TVS device 800 according to another embodiment of the present invention. As shown, TVS device 800 includes four pairs of PIN and NIP diodes and a clamping diode. This device can be used for protection of four I/O pins.

Figure 9:
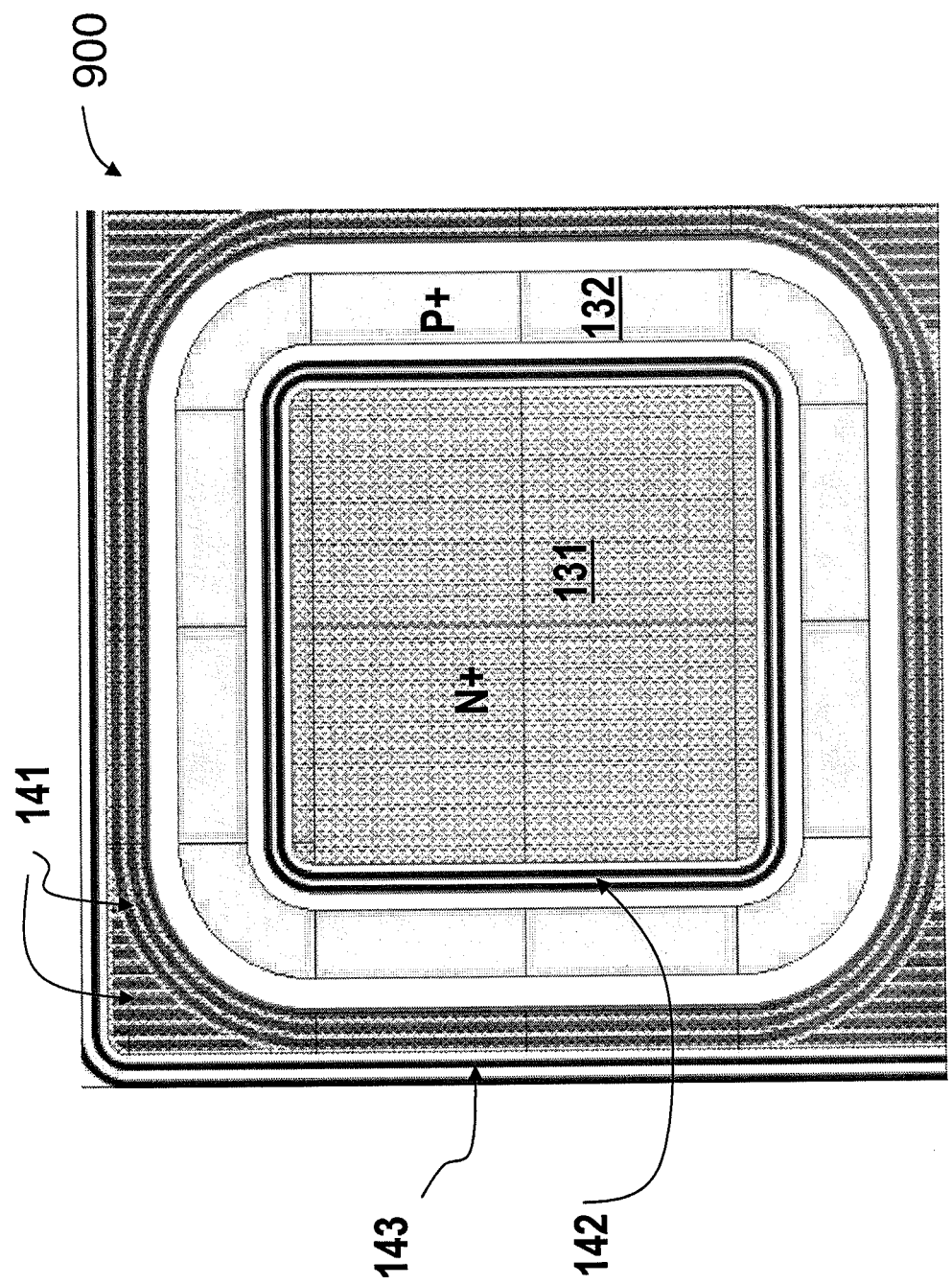
FIG. 9 is a simplified top view diagram of a layout for a portion of a TVS device according to an embodiment of the present invention.

FIG. 9 is a simplified top view diagram of a layout 900 for a portion of TVS device 100 of FIG. 6 according to an embodiment of the present invention. In this specific example, isolation trenches are shown as 142. An inner set of isolation trenches are formed to surround n+ region 131, which is part of the NIP diode. p+ region 132 of the PIN diode is shown on the outside of isolation trenches 142. An outer set of isolation trenches 143 surround the outer perimeter of the device. The n+ trenches 141 are formed in between the p+ region 132 and the outer isolation trenches 143.

FIGS. 10A, 10B, and 11-13 are simplified cross-sectional diagrams illustrating a method for forming a TVS device according to an embodiment of the present invention.

Referring to FIG. 10A, a p+ silicon substrate is obtained (101). This substrate may or may not have incorporated an epitaxial layer. If the silicon wafer does not have an epitaxial layer, then the silicon wafer will have an impurity concentration in the range of 2.5 E18 to 8 E18 cm$^{-3}$. If the silicon wafer does have an epitaxial layer, then the substrate impurity concentration may be substantially higher than 2.5 E 18 cm$^{-3}$. A layer of n-type silicon layer is epitaxially deposited (112) with an impurity concentration in the range of 4 E 13 to 2 E 14 cm$^{-3}$. Wafer bonding can also be used to form layer 112.

Referring to FIG. 10B, an n-type "buried layer" is implanted and diffused into this epitaxial layer (111). The dose of this implant is of the order of 3 E15-1.5 E16 cm$^{-2}$.

Figure 11:
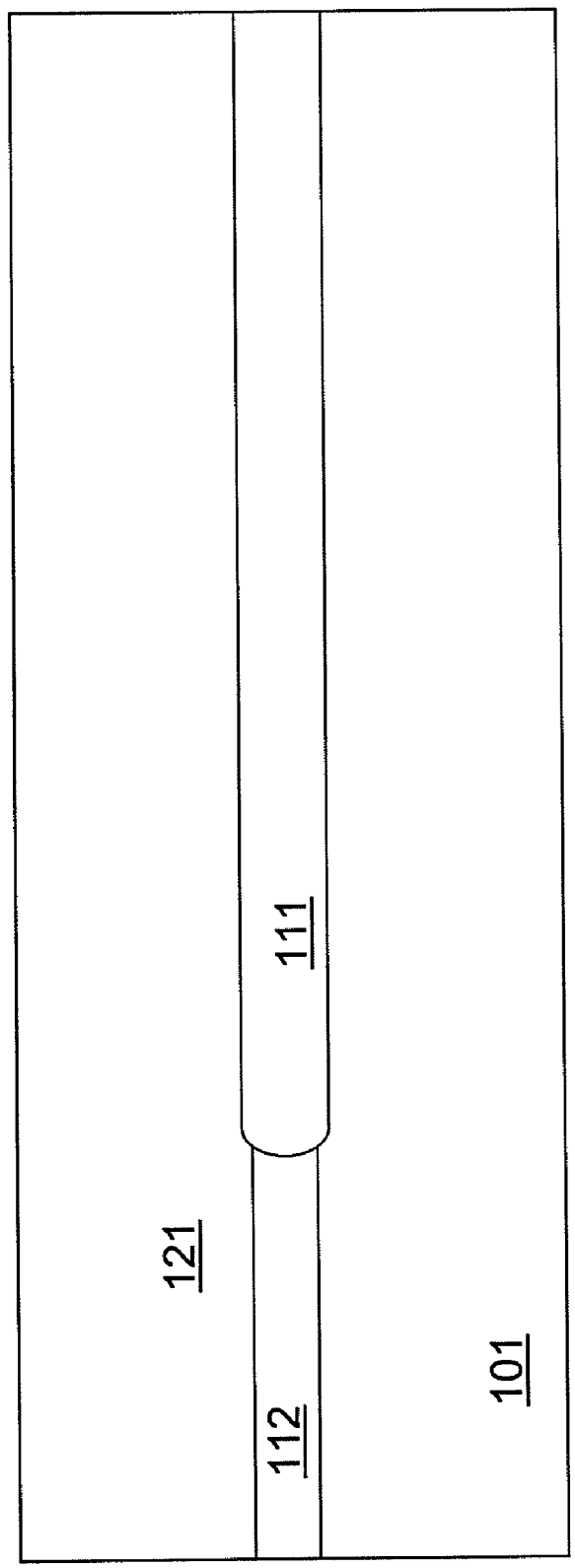

Referring to FIG. 11, onto the structure of FIG. 10B is deposited a second n-type epitaxial layer (121) of substantially the same resistivity as the epitaxial layer (112).

Figure 12:
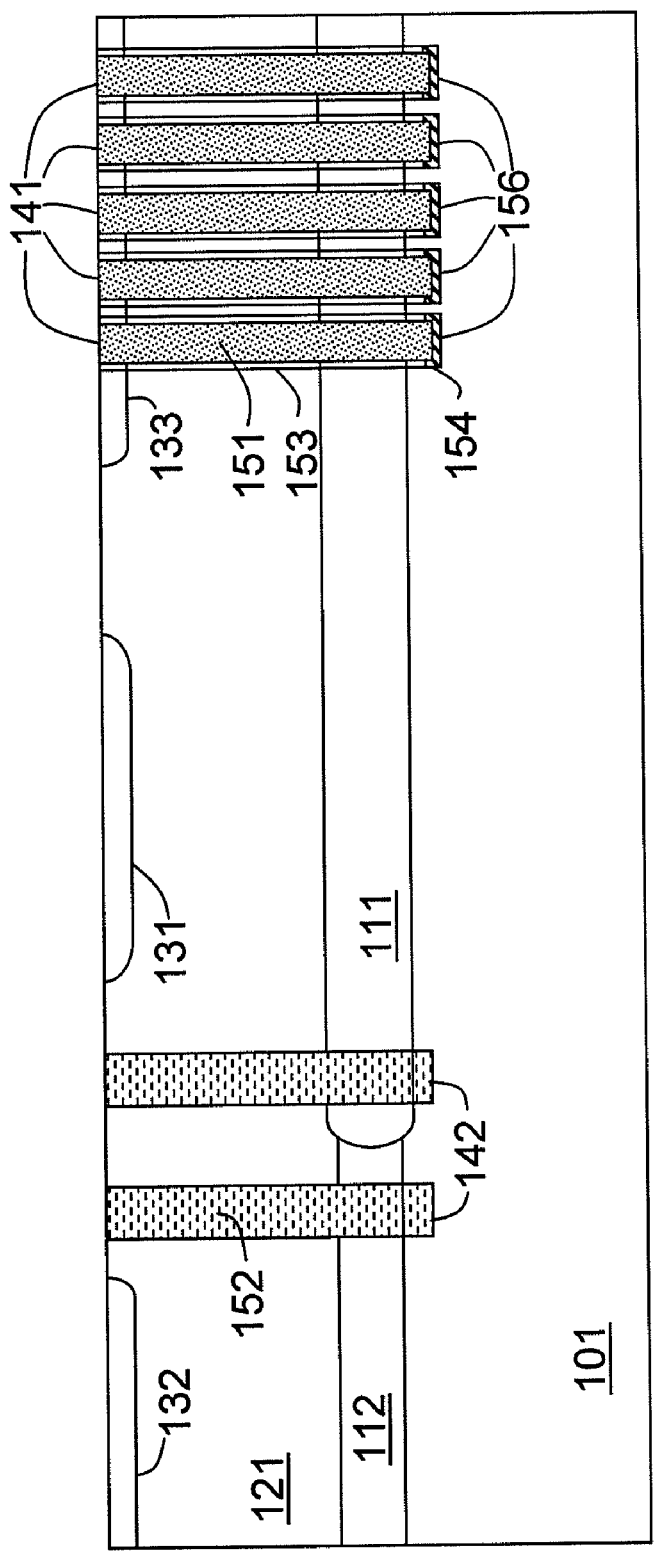

Referring to FIG. 12, into the structure of FIG. 11, dopants are implanted and diffused into the surface n+ (132) with a dose substantially between 5 E 15 cm-2 and 1 E 16 cm-2 and a p+ (131) layer with a dose substantially between 5 E 15 and 1 E 16 cm-2. Two types of trenches are formed, one type filled with dielectric (152), or a substantially dielectric material, and is used for isolation. The other (141) is formed such that its walls are diffused with an n-type dopant (153,156) and filled with a conductor (151) that forms ohmic contact to the n type silicon around these trenches. The clamping diodes are formed around the bottoms of the trenches.

Figure 13:
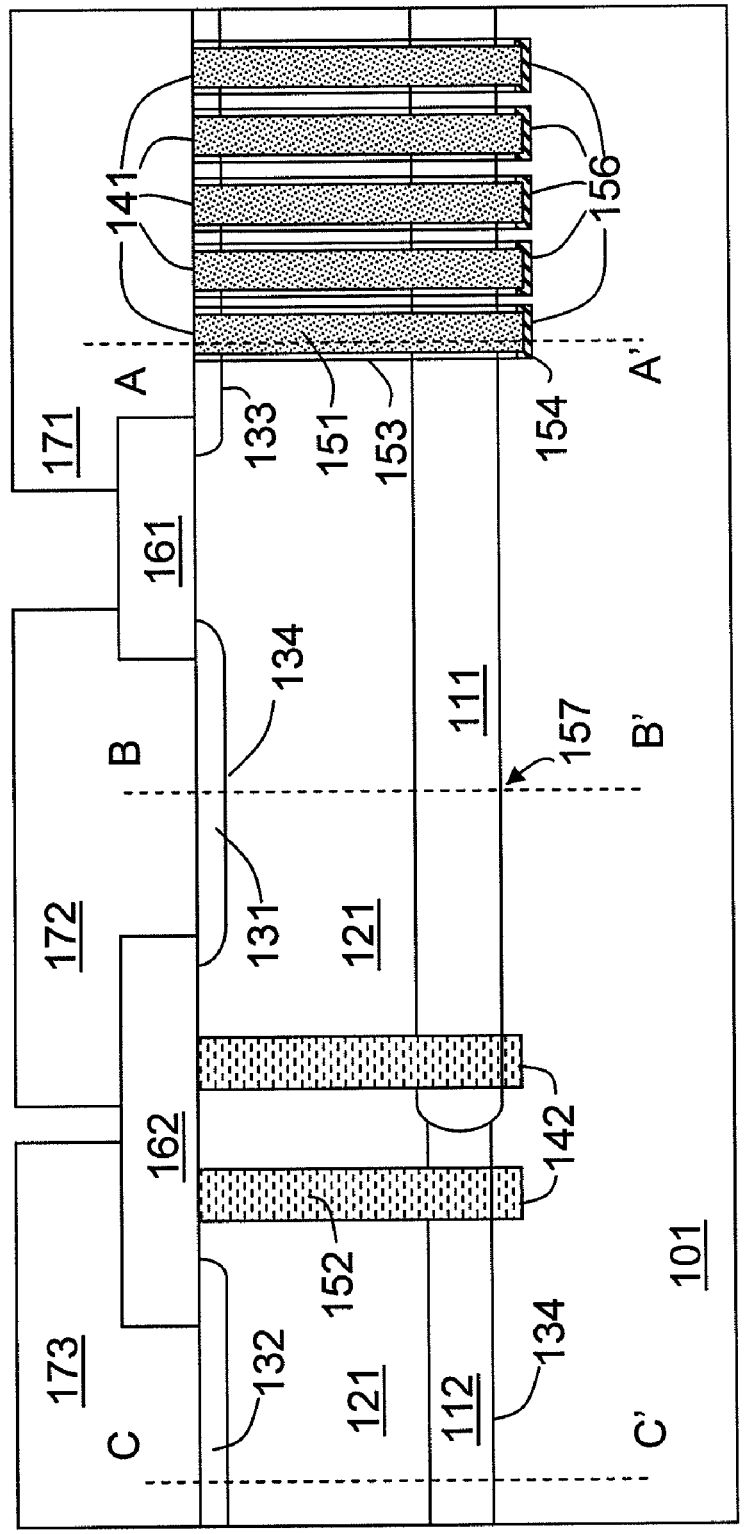

Referring to FIG. 13, an oxide layer (161 and 162) is formed on the surface of the wafer through which contacts are formed. Contact formation is followed by metal deposition and metal patterning (171, 172, and 173). Passivation is then deposited on the surface followed by patterning (not shown in FIG. 13). Backside processing includes wafer thinning and backside metallization forming ohmic contact to the backside of the silicon.

In FIG. 13, the devices formed are as follows: The NIP is formed between 132 and 121, 112 and 101, the PIN is formed between 131, 121 and 111, and the clamping diode is formed between 141, 156 and 101.

Another embodiment of the invention provides a method for forming a transient voltage suppression (TVS) device. The method can be briefly outlined below.

1. providing a semiconductor substrate of a first conductivity type;
2. forming a first and a second semiconductor regions of a second conductivity type overlying the semiconductor substrate, the first region having a first doping concentration and the second region having a second doping concentration;

3. forming a semiconductor layer of the second conductivity type overlying the first and the second semiconductor regions;
4. forming a first trench extending through the semiconductor layer and the first semiconductor region and into the semiconductor substrate;
5. disposing a fill material of the second conductivity type in the first trench; and
6. forming a clamping diode using the fill material and the semiconductor substrate;

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention.

What is claimed is:

1. A transient voltage suppressor (TVS) device, comprising:
    a p-type semiconductor substrate;
    a first and a second n-type semiconductor regions overlying the semiconductor substrate, the first region having a first doping concentration and the second region having a second doping concentration that is lower than the first doping concentration;
    an n-type semiconductor layer overlying the first and the second n-type semiconductor regions;
    a plurality of trenches extending through the n-type semiconductor layer and the first n-type semiconductor region and into the p-type semiconductor substrate;
    an n-type fill material disposed in each of the plurality of trenches;
    a clamping diode having a junction region between out-diffused regions from the n-type fill material and a portion of the p-type semiconductor substrate, wherein:
        the clamping diode is coupled in parallel with a diode junction between the first n-type semiconductor region and the p-type semiconductor substrate, and
        the clamping diode is configured to have a clamping voltage lower than a reverse breakdown voltage of said junction such that said junction is prevented from functioning as a Zener diode;
    a PIN diode including a p-type region, a first portion of the n-type semiconductor layer, and the first n-type semiconductor region;
    an NIP diode including an n-type region, a second portion of the n-type semiconductor layer, the second n-type semiconductor region, and the p-type semiconductor substrate;
    a first isolation region around the PIN diodes;
    a second isolation region around the NIP diodes; and
    a conductor coupling the n-type fill material disposed in each of the trenches.

2. The device of claim 1, wherein the fill material is in direct contact with the first semiconductor layer through a trench sidewall.

3. The device of claim 1, wherein the fill material comprises polysilicon.

4. The device of claim 1, wherein the fill material comprises a doped silicide material.

5. The device of claim 1, wherein each of the first and the second isolation regions comprises a trench isolation region.

6. A transient voltage suppressor (TVS) device, comprising:
    a semiconductor substrate of a first conductivity type;
    a first and a second semiconductor regions of a second conductivity type overlying the semiconductor substrate, the first region having a first doping concentration and the second region having a second doping concentration;
    a semiconductor layer of the second conductivity type overlying the first and the second semiconductor regions;
    a first trench extending through the semiconductor layer and the first semiconductor region and into the semiconductor substrate;
    a fill material of the second conductivity type disposed in the first trench;
    a clamping diode having a junction between an out-diffused region from the fill material and a portion of the semiconductor substrate;
    a first P-N diode formed in a first portion of the semiconductor layer;
    a second P-N diode having a junction between the second semiconductor region and the semiconductor substrate; and
    an isolation region separating the first and the second P-N diodes.

7. The device of claim 6, wherein:
    the clamping diode is coupled in parallel with a junction formed between the first semiconductor region and the semiconductor substrate; and
    the clamping diode is configured to have a clamping voltage lower than a reverse breakdown voltage of said junction such that said junction is prevented from functioning as a Zener diode.

8. The device of claim 6, wherein the first P-N diode is disposed overlying the first semiconductor region.

9. The device of claim 6, wherein the fill material is in direct contact with the first semiconductor layer through a trench sidewall.

10. The device of claim 6, wherein the first trench is free from a dielectric layer on the trench sidewalls.

11. The device of claim 6, wherein the clamping diode has a Zener voltage of 7.0 V or lower.

12. The device of claim 6, wherein the isolation region comprises a trench isolation region enclosing the second P-N diode.

13. The device of claim 6, wherein:
    the first conductivity type is p-type;
    the second conductivity type is n-type;
    the first P-N diode comprises a PIN diode; and
    the second P-N diode comprises an NIP diode.

14. The device of claim 6, wherein:
    the first conductivity type is n-type;
    the second conductivity type is p-type;
    the first P-N diode comprises a NIP diode; and
    the second P-N diode comprises an PIN diode.

15. A semiconductor device, comprising:
    a semiconductor substrate of a first conductivity type;
    a semiconductor layer of a second conductivity type overlying the semiconductor substrate;
    a first trench extending through the semiconductor layer into the semiconductor substrate;
    a fill material of the second conductivity type disposed in the first trench; and
    a clamping diode having a junction between an out-diffused region from the fill material and a portion of the semiconductor substrate.

16. The device of claim 15, wherein the fill material is in direct contact with the first semiconductor layer through a trench sidewall.

17. The device of claim 15, wherein the first trench is free from a dielectric layer on the trench sidewalls.

18. The device of claim 15, wherein the isolation region comprises a trench isolation region enclosing the second P-N diode.

19. The device of claim 15, further comprising:
a first region in the semiconductor layer and being in contact with the first trench;
a second region in the semiconductor layer and being in contact with the semiconductor substrate, but not in contact the first trench;
a first P-N diode formed in the first region;
a second P-N diode formed by the second region and the semiconductor substrate; and
an isolation region separating the first P-N diode and the second P-N diode.

20. The device of claim 19, wherein the first region comprises a buried region in contact with the semiconductor substrate.

21. The device of claim 20, wherein the first P-N diode is disposed overlying the buried region.

22. A semiconductor device, comprising:
a semiconductor substrate of a first conductivity type and having a first doping concentration;
a first semiconductor layer of a second conductivity type overlying the semiconductor substrate, the first semiconductor layer having a second doping concentration;
a doped conductive material extending through the first semiconductor layer into the semiconductor substrate; and
a clamping diode formed by the doped conductive material and a portion of the semiconductor substrate.

23. The device of claim 22, wherein the clamping diode comprises a junction between an out-diffused region from the doped conductive material and a region in the semiconductor substrate.

24. The device of claim 22, wherein the clamping diode has a Zener voltage of 7.0 V or lower.

25. The device of claim 22, wherein the doped conductive material comprises a silicon containing material.

26. A method for forming a transient voltage suppressor (TVS) device, comprising:
providing a semiconductor substrate of a first conductivity type;
forming a first and a second semiconductor regions of a second conductivity type overlying the semiconductor substrate, the first region having a first doping concentration and the second region having a second doping concentration;
forming a semiconductor layer of the second conductivity type overlying the first and the second semiconductor regions;
forming a first trench extending through the semiconductor layer and the first semiconductor region and into the semiconductor substrate;
disposing a fill material of the second conductivity type in the first trench; and
forming a clamping diode at a junction between the fill material and the semiconductor substrate.

27. The method of claim 26, wherein disposing the fill material of the second conductivity type in the first trench comprises depositing a polysilicon material.

28. The method of claim 26, wherein forming the clamping diode comprises using a thermal process to form a clamping diode junction between an out-diffused region and a region in the semiconductor substrate.

29. The method of claim 28, wherein forming a first trench comprises forming the first trench to a selected depth into the semiconductor substrate such that the dopant concentration of the semiconductor substrate is higher at the clamping diode junction than is at a junction formed between the first semiconductor region and the semiconductor substrate.

30. The method of claim 26, further comprising:
forming a first P-N diode formed in a first portion of the semiconductor layer; and
forming a second P-N diode having a junction between the second semiconductor region and the semiconductor substrate.

31. The method of claim 30, further comprising forming an isolation region separating the first and the second P-N diodes.

32. The method of claim 30, wherein the isolation region comprises a trench isolation region enclosing the second P-N diode.

* * * * *